United States Patent
Marino et al.

(10) Patent No.: US 9,966,435 B2
(45) Date of Patent: May 8, 2018

(54) BODY TIED INTRINSIC FET

(71) Applicant: ETA Semiconductor Inc., San Jose, CA (US)

(72) Inventors: Fabio Alessio Marino, San Diego, CA (US); Paolo Menegoli, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days. days.

(21) Appl. No.: 14/963,400

(22) Filed: Dec. 9, 2015

(65) Prior Publication Data
US 2017/0170276 A1   Jun. 15, 2017

(51) Int. Cl.
| | |
|---|---|
| H01L 29/66 | (2006.01) |
| H01L 21/336 | (2006.01) |
| H01L 29/10 | (2006.01) |
| H01L 29/06 | (2006.01) |
| H01L 29/08 | (2006.01) |
| H01L 29/417 | (2006.01) |
| H01L 29/78 | (2006.01) |

(52) U.S. Cl.
CPC ...... H01L 29/1033 (2013.01); H01L 29/0649 (2013.01); H01L 29/0847 (2013.01); H01L 29/41783 (2013.01); H01L 29/66568 (2013.01); H01L 29/78 (2013.01)

(58) Field of Classification Search
CPC .................................................. H01L 21/26586
USPC .......................................... 257/328; 438/197
See application file for complete search history.

(56) References Cited

U.S. PATENT DOCUMENTS

| | | | |
|---|---|---|---|
| 5,289,027 A | 2/1994 | Terril et al. | |
| 5,497,019 A | 3/1996 | Mayer et al. | |
| 6,245,607 B1 | 6/2001 | Tang et al. | |
| 6,413,802 B1 | 7/2002 | Hu et al. | |
| 6,797,576 B1 * | 9/2004 | Teng ................. | H01L 21/26586 |
| | | | 257/E21.345 |
| 6,815,772 B2 | 11/2004 | Takemura | |
| 8,803,242 B2 | 8/2014 | Marino et al. | |

(Continued)

OTHER PUBLICATIONS

Priciples of Electronoic Devices, B. Van Zeghbroeck, 2011, chapter 2.3.3.4.*

*Primary Examiner* — Igwe U Anya
(74) *Attorney, Agent, or Firm* — Patterson & Sheridan, L.L.P.

(57) ABSTRACT

A novel semiconductor transistor is presented. The semiconductor structure has a MOSFET like structure, with the difference that the device channel is formed in an intrinsic region, so as to effectively decrease the impurity and surface scattering phenomena deriving from a high doping profile typical of conventional MOS devices. Due to the presence of the un-doped channel region, the proposed structure greatly reduces Random Doping Fluctuation (RDF) phenomena decreasing the threshold voltage variation between different devices. In order to control the threshold voltage of the device, a heavily doped poly-silicon or metallic gate is used. However, differently from standard CMOS devices, a high work-function metallic material, or a heavily p-doped poly-silicon layer, is used for an n-channel device and a low work-function metallic material, or heavily n-doped poly-silicon layer, is used for a p-channel FET. Doped or insulating regions are used to increase the control on the channel conductivity.

20 Claims, 16 Drawing Sheets

(56) References Cited

U.S. PATENT DOCUMENTS

| | | | |
|---|---|---|---|
| 2002/0097608 A1* | 7/2002 | Skotnicki | H01L 29/0653 365/185.27 |
| 2003/0222290 A1* | 12/2003 | Rodov | H01L 29/1095 257/282 |
| 2005/0151172 A1* | 7/2005 | Takemura | H01L 21/26586 257/288 |
| 2006/0084247 A1* | 4/2006 | Liu | H01L 21/28097 438/510 |
| 2006/0249815 A1* | 11/2006 | Forbes | H01L 31/1808 257/616 |
| 2007/0020865 A1* | 1/2007 | Chen | H01L 21/82344 438/301 |
| 2007/0075351 A1* | 4/2007 | Schulz | H01L 21/823821 257/314 |
| 2009/0315124 A1* | 12/2009 | Chen | H01L 27/105 257/411 |
| 2011/0074498 A1 | 3/2011 | Thompson et al. | |
| 2012/0001143 A1* | 1/2012 | Strukov | B82Y 10/00 257/2 |
| 2012/0037995 A1* | 2/2012 | Kim | H01L 29/0847 257/368 |
| 2013/0069164 A1* | 3/2013 | Marino | H01L 21/823431 257/369 |
| 2013/0181215 A1* | 7/2013 | Adekore | H01L 29/12 257/43 |
| 2014/0264379 A1* | 9/2014 | Kub | H01L 29/41725 257/77 |

\* cited by examiner

BODY TIED INTRINSIC FET

BACKGROUND OF THE INVENTION

1. Field of the Invention

The present invention is in the field of semiconductor structures. The present invention is further in the field of semiconductor structures of transistor devices. The present invention further relates to the field of integrated devices and circuits. The implementation is not limited to a specific technology, and applies to either the invention as an individual component or to inclusion of the present invention within larger systems which may be combined into larger integrated circuits.

2. Brief Description of Related Art

The driving force for the semiconductor industry growth has been the elegant scaling nature of CMOS technology. This aggressive trend poses several technology and circuit design challenges. One such challenge is the expected increase in threshold voltage variation due to worsening Short Channel Effect (SCE) and Random Dopant Fluctuation (RDF).

Nevertheless, with proper control of the doping profile, the limit of CMOS scaling can be extended to 20-nm channel length without strict scaling of oxide thickness and power-supply voltage. An optimum design for 20-nm MOSFET calls for a vertically and laterally non-uniform doping profile, the super-halo, to control the short-channel effect. Halo doping, or non-uniform channel profile in the lateral direction, can be realized by angled ion implantation self-aligned to the gate, with a very restricted amount of diffusion. Retrograde doping, or vertically non-uniform doping profile instead is obtained by increasing the dopant concentration in the channel as it extends vertically downwards (away from the gate toward the substrate).

The highly non-uniform profile sets up a higher effective doping concentration toward shorter devices, which counteracts short-channel effects. In terms of the threshold-voltage sensitivity to channel-length variations, the super-halo profile extends the scaling limit by a factor of nearly 2.

Even if this approach allows the reduction of SCE, it still requires to maintain a relatively high doping concentration in the channel region in order to obtain a positive threshold voltage and keep the leakage current under acceptable values. Therefore, super-halo profiles, or similar techniques (such as retrograde doping), do not eliminate issues related with random dopant density fluctuations, which can increase the threshold voltage variation to unacceptable levels.

Even if the fluctuations associated with lithographic dimensions and layer thicknesses are well controlled, random fluctuations of the relatively small number of dopants and their discrete microscopic arrangement in the channel of sub-0.1 μm MOSFET lead to significant variations in the threshold voltage and drive current. Such fluctuations may seriously affect the functionality, performance, and yield of the corresponding systems.

Another important limitation related to high channel doping is the degradation of the carrier mobility associated with the impurity scattering and quantum confinement phenomena that take place in the device channel. These phenomena reduce the drive current in the device heavily degrading the device performance.

In particular, in the area of power integrated circuits (e.g. Power Amplifiers and/or power converters) the silicon area occupied by the transistors, and their performance, is more and more important in several applications. A very critical parameter for transistors in integrated circuits is their specific $R_{DSon}$, measured in $\Omega*mm^2$. The silicon area is directly proportional to the cost of the integrated circuit and a low on-resistance is always desirable to increase the efficiency of the circuit and to reduce the power dissipation and therefore the temperature of the chip.

The most important Figure Of Merit (FOM) of a transistor in specific power applications is the $R_{DSon}*Q$ of the transistor where $R_{DSon}$ is the on-resistance while Q is the charge associated with the gate capacitance ($C*V$). This FOM is directly associated with the time constant of the device. The lower the $R_{DSon}$ and the gate charge, the higher the achievable efficiency. In conventional CMOS technology, this FOM is independent from the silicon area since a lower $R_{DSon}$ deriving by an increase of the device size is generally correlated with an increase of the gate capacitance by the same amount.

Several prior art attempts to improve threshold control and at the same time increase carrier mobility, so as to effectively obtain low on-resistance components with high-yield, have been documented. One example is reported in Terril et al. (U.S. Pat. No. 5,289,027), where an intrinsic channel SOI MOSFET with a buried oxide is described.

The advantage of the structure proposed in the cited prior art lies in the increase of the carrier mobility associated with the use of an intrinsic channel region. However, this advantage comes at the cost of an increase of the short channel effects, such as punch-through phenomena. In order to reduce such effects and increase the threshold voltage, the authors added a buried insulating layer and a back gate electrode under the channel region. This solution, even if very effective to reduce SCE, requires a much more complex and costly manufacturing process involving Double Gate Silicon On Insulator technology, which is still quite expensive nowadays.

Other prior art attempts to improve the control on the carrier transport in the device so as to effectively obtaining low on-resistance components are reported in Takemura (U.S. Pat. No. 6,815,772), Mayer et al. (U.S. Pat. No. 5,497,019), and Hu et al. (U.S. Pat. No. 6,413,802). The general approach in the cited references is to add more control gate to the device in order to reduce short channel effects. This allows also the reduction of the channel doping and therefore an increase of the carrier mobility.

These examples, however, require Multi-Gate Silicon On Insulator technology. A second problem is the alignment of the different gates of the device. Moreover, since their main objective is to enhance the control of the carrier transport, the thickness of the channel region must be lower than the maximum extension of the depletion region in the channel region, limiting the channel width in some configuration. Finally, since these devices operate in fully-depleted mode, they do not have the intrinsic body diodes typical of conventional bulk MOS devices. This characteristic limits the range of applications suitable for these technologies.

Another interesting prior art attempt to achieve higher carrier mobility while reducing the threshold variation is described in Thompson et al. (US 2011/0074498). In this case a MOSFET device with an intrinsic channel is obtained using a non-uniform doping profile and the value of the threshold voltage is adjusted by biasing the body of the MOSFET.

This configuration unfortunately is not practical, since it can be used only for an array of MOSFET connected all in parallel. Since the threshold voltage is adjusted varying the body voltage, each transistor not connected in parallel must be built in an isolated well, adding to the silicon area and therefore to the cost of the solution.

Another prior art attempt to achieve higher current density for transistor devices is described in Tang et al. (U.S. Pat. No. 6,245,607). In this case an n-type buried channel MOSFET with a p+ poly-silicon gate is described. Also in this case the biasing of the substrate is used to dynamically adjust the threshold voltage at the desired value.

Unfortunately also this solution, suffers from the same drawbacks of the previous cited prior art reference, since the body voltage must differ between various devices. Furthermore, since the channel region has been n-doped, the RDF phenomena still cause high threshold voltage variation in the process flow.

Although the cited prior art references describe structures that present an enhanced carrier mobility, they are not very practical to be used in modern integrated circuits, where it is impossible to separately bias the body terminal of each device without increasing their leakage current and forming separated wells for each of them.

It is therefore a purpose of the present invention to describe a novel structure of a semiconductor transistor that offers the advantage of improving the carrier mobility and reducing the threshold voltage variation, without requiring expensive process modifications and/or dynamically varying the bias of the body terminal.

SUMMARY OF THE INVENTION

The present invention describes a transistor which has a MOSFET like structure, with the difference that the device channel is formed in an intrinsic region, so as to effectively decrease the impurity and surface scattering phenomena deriving from an high doping profile into the channel typical of conventional MOS devices. Due to the presence of the un-doped channel region, the proposed structure greatly reduces Random Dopant Fluctuation phenomena drastically decreasing the threshold voltage variation between different devices. In order to control the threshold voltage of the device, a heavily doped poly-silicon or metallic gate is used. However, differently from standard CMOS devices, a high work-function metallic material, or a heavily p-doped poly-silicon layer, is used for an n-channel device and a low work-function metallic material, or heavily n-doped poly-silicon layer, is used for a p-channel FET. A heavily doped region placed laterally to the channel is used to control the Short Channel Effects.

In order to better understand this concept, let us consider the structure illustrated in FIG. 1, where a tridimensional view of a possible implementation of the present invention is shown (in this figure, the gate region and the corresponding oxide have been lifted so as to show the channel region) and FIG. 2, where a cross section view of the embodiment of FIG. 1 is shown. As it can be seen, conventional device terminals (source, gate and drain) are present. However the channel region under the gate oxide is made intrinsic (or near-intrinsic) allowing for an improvement of the carrier mobility.

The electrons in the channel are free to move with a reduced impurity scattering and their confinement at the channel surface is lowered, allowing for a notable improvement in the charge transport (since the transport becomes partially bulk, reducing the surface scattering phenomena).

Short channel effects are controlled by the use of one or more heavily doped regions located on the lateral sides of the channel. These heavily doped regions create a lateral potential barrier improving the confinement of the electrons in the intrinsic region under the gate-oxide and bias any quasi neutral region eventually present below the gate-oxide so as to effectively inhibit undesired punch-through effects. These heavily doped regions can be or not aligned with the gate region edges, and they can extend or not to the source and/or drain regions if desired. Furthermore, one of these two regions can be removed if desired. In all the embodiments of the present invention a low or moderate p-doped region can be added between one or more of the heavily p-doped regions and the intrinsic (or near intrinsic) channel region.

In order to obtain a sufficiently positive threshold voltage, the work-function of the gate material must be equal or greater than the sum of the electron affinity and half energy-gap of the channel material. This result can be easily achieved using a heavily p-doped poly-silicon gate. Such choice increases the threshold voltage of the device, reducing the standby leakage current. Furthermore, due to the increase in carrier mobility, the drive current remains high even if the threshold voltage of the device can result even higher than in conventional MOS devices.

A similar technique where the work-function of the gate has been used to compensate the low channel doping was used also in U.S. Pat. No. 8,803,242 filed by the same Applicants on Sep. 19, 2011. However, in U.S. Pat. No. 8,803,242 the Short Channel Effects were controlled through the use of a doped back-barrier located underneath the channel (instead of being placed on a lateral side with respect to the channel). Placing the doped-barrier on a lateral side of the channel (instead of underneath it) allows to simplify the manufacturing process. Conventional CMOS SOI and BULK manufacturing processes can be used to obtain the herein disclosed structure since the device requires only superficial implantations.

Polycrystalline silicon (poly-Si) has been used as a MOSFET gate material for several decades. One of the primary reasons for this is its high compatibility with CMOS processing. Poly-Si can be very easily deposited by low pressure chemical vapor deposition (LPCVD) techniques and it displays excellent thermal stability on SiO2, which has been the gate dielectric of choice for MOSFETs. However research, over the last few years, indicates an ever increasing use of metals and metal based gate stack materials for future CMOS devices.

If a metallic gate material is used, the threshold voltage can be engineered to the desired value using a metallic material with an appropriate work-function i.e., greater than the electron affinity plus half the energy-gap of the channel material for nMOS devices and lower than the electron affinity plus half the energy-gap for a p-type MOS. As well known to anyone skilled in the art, also doped metallic materials, such as doped Molybdenum, can be used.

If needed, it is possible to utilize the same metallic material (e.g. tungsten) with a work function substantially equal to the electron affinity plus half the energy-gap of the channel material (e.g. about 4.6 eV for Si) for both nMOS and pMOS devices. This choice, however, can be tolerated only if a low threshold value (around 0.2-0.3V) can be accepted. A fine tuning of the threshold voltage can be obtained by varying the distance between the lateral heavily doped regions and the channel region underneath the gate oxide, and/or the gate width. The lateral highly doped regions can overlap (or not) with the gate.

The gate dielectric may include conventional dielectric materials such as oxides, nitrides and oxynitrides, or can be formed with higher dielectric constant insulating materials, such as hafnium oxides, hafnium silicates, zirconium oxides, lanthanum oxides, titanium oxides, barium-strontium-titanates and lead-zirconate-titanates, metal based dielectric materials, and other materials. Preferred hafnium-containing oxides include $HfO_2$, $HfZrO_x$, $HfSiO_x$, $HfTiO_x$, $HfAlO_x$, and the like.

As mentioned above, the proposed structure greatly reduces the Random Dopant Fluctuation phenomena, drastically decreasing the threshold voltage variation between different devices. In general, the use of a substantially un-doped channel region can also enhance the effectiveness of certain conventional techniques often used to improve transistor performance. For example, the source and drain regions can be structured to modify stress applied in the channel region. Alternatively, the channel region can be modified by lattice matched and strained silicon germanium (SiGe) crystalline thin film lattice placed to cause a compressive strain in an in-plane direction of the channel. This causes changes in band structure such that hole mobility increases as compared with intrinsic Si. Stress conditions can be modified by changing germanium (Ge) composition (higher Ge increases strain and the hole mobility becomes higher).

For tensile strain, the Si channel region can be formed on lattice-relaxed SiGe having a greater lattice constant. This results in both the electron mobility and the hole mobility increasing as compared with unstrained Si channel regions. Also in this case, as germanium composition of the base SiGe is increased, the amount of the strain in the strained Si channel region and the carrier mobilities tend to increase. Due to the reduced scattering and confinement effects, stress enhanced mobility is significantly larger than in a conventional device.

One or more of the optional regions 12, 15, 18 and 20 can be removed or it can be made of intrinsic, p-doped, or n-doped semiconductor, or it can be made of dielectric material (e.g. oxide). In particular, these regions (12, 15, 18 and 20) can be also heavily n-doped so as to effectively extend the source and drain regions of the device beyond the intrinsic channel region. Similar considerations hold true for all the embodiments herein described. If desired, one or both heavily p-doped regions can be extended to touch or replace these regions (when present).

Many doping profiles can be used in order to improve the device performance. For example, as shown in FIG. 3, the source and drain regions can be formed in two p-well regions so as to further limit the Short channel effects. As well known to anyone skilled in the art, LDD regions and/or p+ halo implants can be added to any embodiments of the present invention as shown in FIG. 4.

If desired, the source and drain regions can be raised with respect to the intrinsic channel layer. In all the embodiments herein discussed a p-doped region can be added under the intrinsic channel as shown in FIG. 4, so as to operate as a potential barrier for the carriers, improving their confinement into the intrinsic channel. This extra region is optional and its use depends on the doping level of the channel region. Furthermore, it can be substituted with a super halo profile or other doping profiles (such as retrograde doping profiles).

As shown in FIG. 5, the heavily p-doped regions can be extended laterally to the source region and eventually shorted with it, so as to simplify the body contact configuration. Alternatively, the heavily p-doped regions can be limited to the source side as shown in FIG. 6.

If desired, also in the embodiments of FIGS. 5 and 6 one or more of the optional regions 49, 52, 58 and 61 can be removed or it can be made of intrinsic, p-doped, or n-doped semiconductor, or it can be made of dielectric material (e.g. oxide). In particular, these regions (49, 52, 58 and 61) can be also heavily n-doped so as to effectively extend the drain regions of the device beyond the intrinsic channel region. Similar considerations hold true for all the embodiments herein described.

In any of the embodiments herein discussed, one or two p-doped regions can be added laterally to the intrinsic channel as shown in FIG. 7, so as to increase the confinement of the carriers inside the channel region. Furthermore, any of the embodiments herein described can be implemented with a drain extension, where a drift region is added between the drain region and the channel region to increase the voltage withstanding capability of the device. An example of implementation of the present invention with a drain extension is shown in FIG. 8, which has been derived from the embodiment of FIG. 7. If desired, the p-doped regions 80 and 86 can be extended also laterally to the drift region or the regions 81 and 84 can be p-doped so as to form a super junction configuration on the drain side of the transistor.

In all the embodiments herein described, the control on the channel conductivity can be increased by extending the gate above the lateral doped regions (only on one side or on both sides), so as to use the field lines generated by the gate to laterally control the potential distribution inside the channel region. An example of embodiments of the present invention employing this principle is shown in FIG. 9.

Another interesting embodiment of the present invention is shown in FIG. 10, where the lateral doped regions have been replaced by oxide regions. Also in this embodiment, the gate region can be (optionally) extended over one or both lateral regions so as to effectively increase the control on the channel conductivity.

Two or more of the implementations herein discussed can be also combined. For example, as shown in FIG. 11 a p-doped region (heavily doped or moderate doped) can be placed only on one side of the device, while a dielectric region (e.g. and oxide region) is formed on the opposite side. A similar configuration can be obtained combining any of the embodiments of FIG. 1-9 with the embodiments of FIG. 10. Also in this case, if desired, the gate region can be extended over the dielectric region and/or the doped region (especially when the doped region is not heavily doped).

FIG. 12 depicts a tridimensional view of the preferred embodiment of the present invention, where a more general implementation is shown. Region 126 can be formed with a different material or different doping level with respect to region 131. Furthermore, regions 126 (and/or region 123) can extend to touch regions 127 and 125 (or not). Similarly regions 131 (and/or region 129) can extend to touch regions 130 and 132 (or not). If regions 126 and 131 are not heavily doped or made of dielectric material, two heavily doped regions 123 and 129 can be used (when present) to contact these regions, respectively. Alternatively, regions 125 and 132 can be heavily p-doped to guarantee the bias of regions 126 and 131.

Multiple structures as the ones shown in FIG. 1-12 can be connected in parallel to increase the current capability and reduce the on-resistance of the device. Three example of multiple transistors according to the present invention connected in parallel is shown in FIG. 13-15. The embodiment of FIG. 13 illustrate the TOP view or layout view of three transistors according to the embodiment of FIG. 9 connected in parallel. The layout of FIG. 14 is obtained by connecting in parallel three transistors resembling the embodiment of FIG. 10. The structure of FIG. 15 is obtained by connecting in parallel two transistors according to the embodiment of FIG. 11.

FIG. 16 shows a top view (or layout view) of a FET device according to a further embodiment of the present invention derived from the embodiment of FIG. 11 by removing the lateral dielectric region. In all the embodiments of the present invention a low or moderate p-doped region can be added between one or more of the heavily p-doped regions and the intrinsic (or near intrinsic) channel region without changing the scope of the present invention.

All the embodiments herein described can be implemented in SOI or non-SOI COMS technology. For all the MOS structures described above, also the equivalent p-channel version can be obtained by simply substituting the n-doped regions with p-type regions and vice versa, and using a low work-function material (i.e. a metallic material with a work-function lower than the one of the channel region or a heavily n-doped poly-silicon layer). In general, the channel layer can be also low-doped (e.g. dopant concentration <1e16 cm$^{-3}$) with p- or n-type impurities (independently from the conductivity type of the device channel) in order to tune the threshold voltage (e.g. an n-doping can be used for lowering the threshold voltage in a n-channel MOS, whereas a p-doping type can be used to increase the threshold voltage), without degrading too much the device characteristics.

Most of the device structure described above can be obtained by means of standard CMOS SOI or non-SOI manufacturing processes. This makes the present invention very cost attractive.

It is therefore an object of the present invention to increase the carrier mobility and to reduce the device parasitic capacitance by utilizing an intrinsic channel combined with a high work-function gate material in case of n-channel FET and a low work-function gate material in case of p-channel FET.

As is clear to those skilled in the art, this basic system can be implemented in many specific ways, and the above descriptions are not meant to designate a specific implementation.

BRIEF DESCRIPTIONS OF THE DRAWINGS

The features, objects, and advantages of the present invention will become apparent upon consideration of the following detailed description of the invention when read in conjunction with the drawings in which.

DETAILED DESCRIPTION OF SPECIFIC EMBODIMENTS

A FIG. 1

Figure 1:
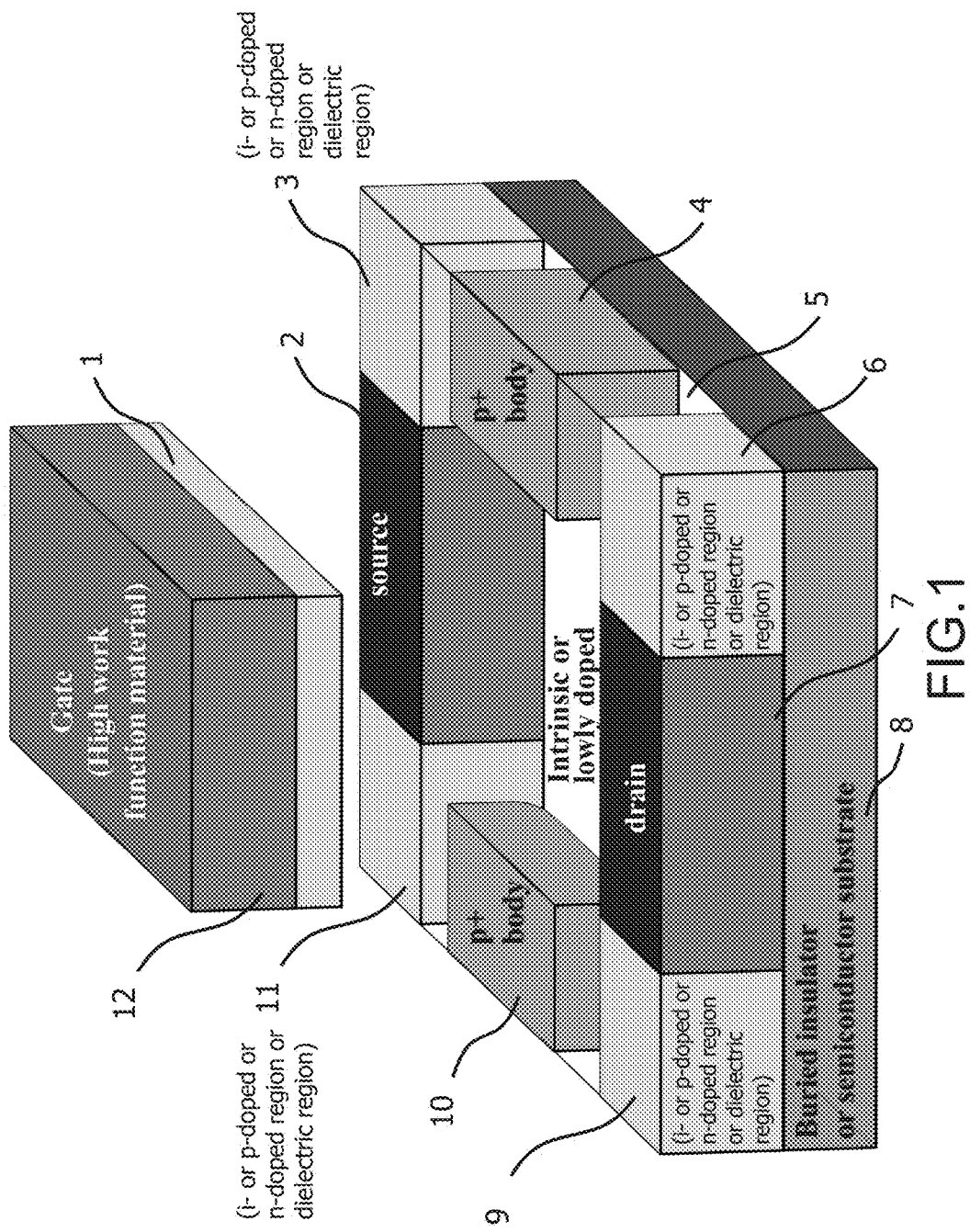
FIG. 1 shows a tridimensional view of a FET device according to a first embodiment of the invention.

FIG. 1 is showing the first embodiment of the present invention. Regions 2 and 7, which can be made in n+-type semiconductor or metal, define the drain and the source of the transistor. The region 1 corresponds to the gate-oxide, and the region 8 is a buried dielectric layer if the device is manufactured in SOI technology or the semiconductor substrate of the device if this is implemented in bulk technology. The gate region 12, which can be built in metal or poly-silicon, forms the gate of the transistor. Differently from a conventional MOS device where the channel region is p-doped and the gate is made in n+-doped poly-silicon or with a low work-function metallic material, the channel region 5 of this embodiment is maintained intrinsic (or near intrinsic), and the gate 12 is formed with a high work-function material.

The present invention therefore defines a MOS device with a higher carrier mobility, which leads to a significant improvement of the device performance. Since the channel region is substantially un-doped, the impurity scattering and the surface roughness scattering phenomena are greatly reduced.

The un-doped channel also minimizes Random Dopant Fluctuation phenomena, greatly reducing the threshold voltage variation across different devices due to the manufacturing process. This is a very important characteristic, since, in certain applications, it allows the reduction of the device dimensions and therefore of the cost associated with the final IC.

Short channel effects are controlled by the use of one or more lateral p-doped regions, which allow the creation of a doped barrier and supply fixed negative charge when depleted, improving the confinement of the electrons in the intrinsic region under the gate-oxide so as to effectively inhibit undesired punch-through effects.

In order to obtain a sufficiently positive threshold voltage, the work-function of the gate material must therefore be equal or greater than the sum of the electron affinity with half energy-gap. This result can be easily achieved using a heavily p-doped poly-silicon gate. Such choice increases the threshold voltage of the device, reducing the standby leakage current. Furthermore, due to the increase in carrier mobility, the drive current remains high even if the threshold voltage of the device results higher than in conventional MOS devices.

Alternatively, a metallic material can be used for the gate. In this case, the threshold voltage can be engineered to the desired value using a metallic material with an appropriate work-function i.e., greater than the electron affinity plus half the energy-gap of the channel material for nMOS devices and lower than the electron affinity plus half the energy-gap for p-type MOS. As well known to anyone skilled in the art, also doped metallic materials, such as doped Molybdenum, can be used.

If needed, it is possible to utilize the same metallic material (e.g. tungsten) with a work function equal to the electron affinity plus half the energy-gap of the channel material (e.g. about 4.6 eV for Si) for both nMOS and pMOS devices. This choice, however can be tolerated only if a low threshold values (around 0.2-0.3V) can be accepted. A fine tuning of the threshold voltage can be obtained by varying the doping profile of the substrate.

The gate dielectric may include conventional dielectric materials such as oxides, nitrides and oxynitrides, or can be formed with higher dielectric constant dielectric materials, such as hafnium oxides, hafnium silicates, zirconium oxides, lanthanum oxides, titanium oxides, barium-strontium-titanates and lead-zirconate-titanates, metal based dielectric materials, and other materials. Preferred hafnium-containing oxides include $HfO_2$, $HfZrO_x$, $HfSiO_x$, $HfTiO_x$, $HfAlO_x$, and the like.

Provision for a transistor having a substantially un-doped channel brings other advantages when stress is applied. For example, stress may be applied by compressive or tensile stress applied via the source/drain or channel stress techniques (involving SiGe alloys). As compared to conventional nanoscale transistors with uniformly or highly doped channels, a strained channel region FET transistor will provide a larger strain enhanced mobility due to the low concentrations of dopants near the gate dielectric (reduced ionized impurity scattering) and the lower electric field (reduced surface roughness scattering). Due to the reduced scattering, stress enhanced mobility will be significantly larger than in a conventional device.

B FIG. 2

Figure 2:
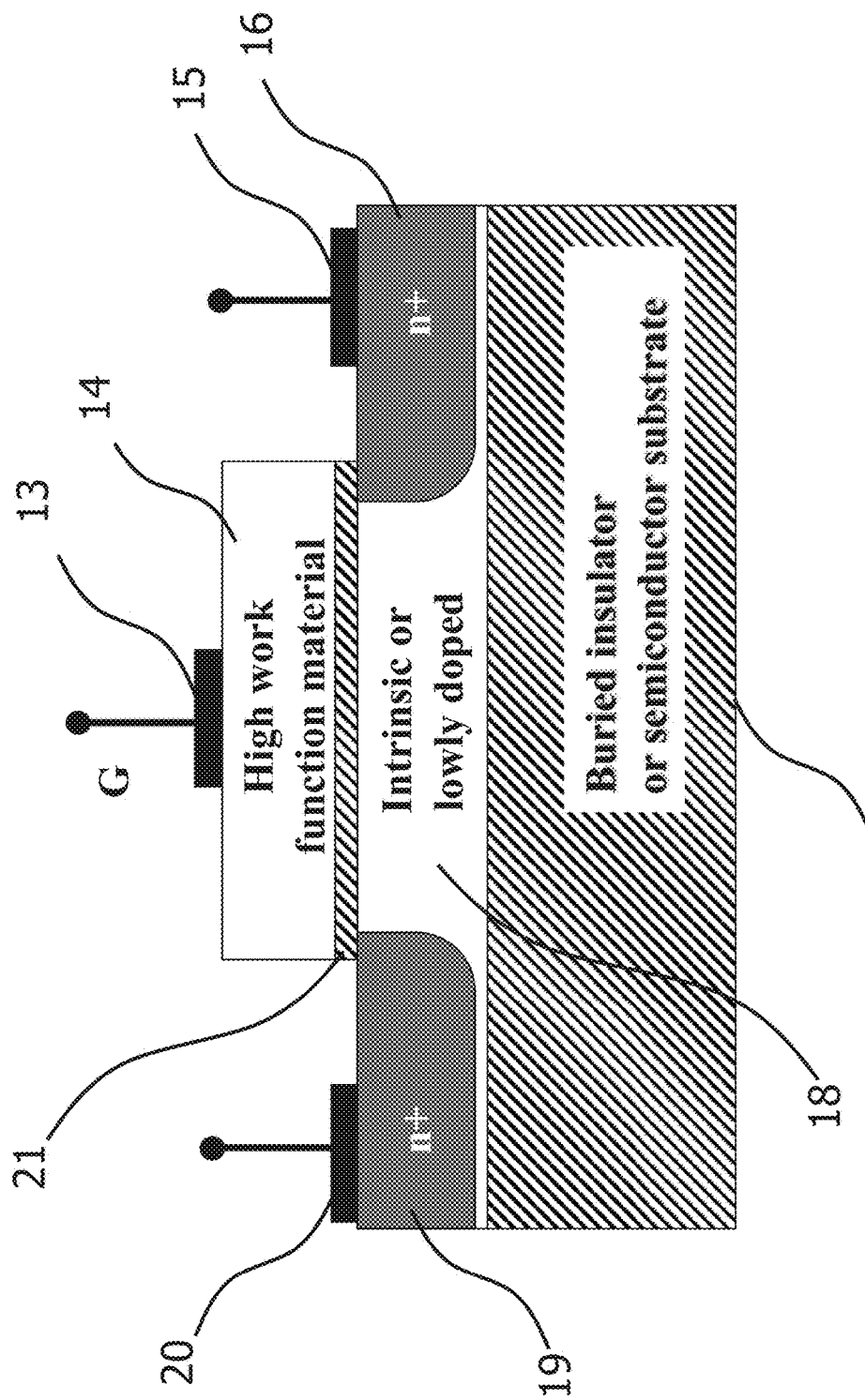
FIG. 2 shows a cross section view of the embodiment of FIG. 1.

FIG. 2 depicts a possible cross section of the embodiment of FIG. 1 in a plane connecting the source and drain region of the device.

C FIG. 3

Figure 3:
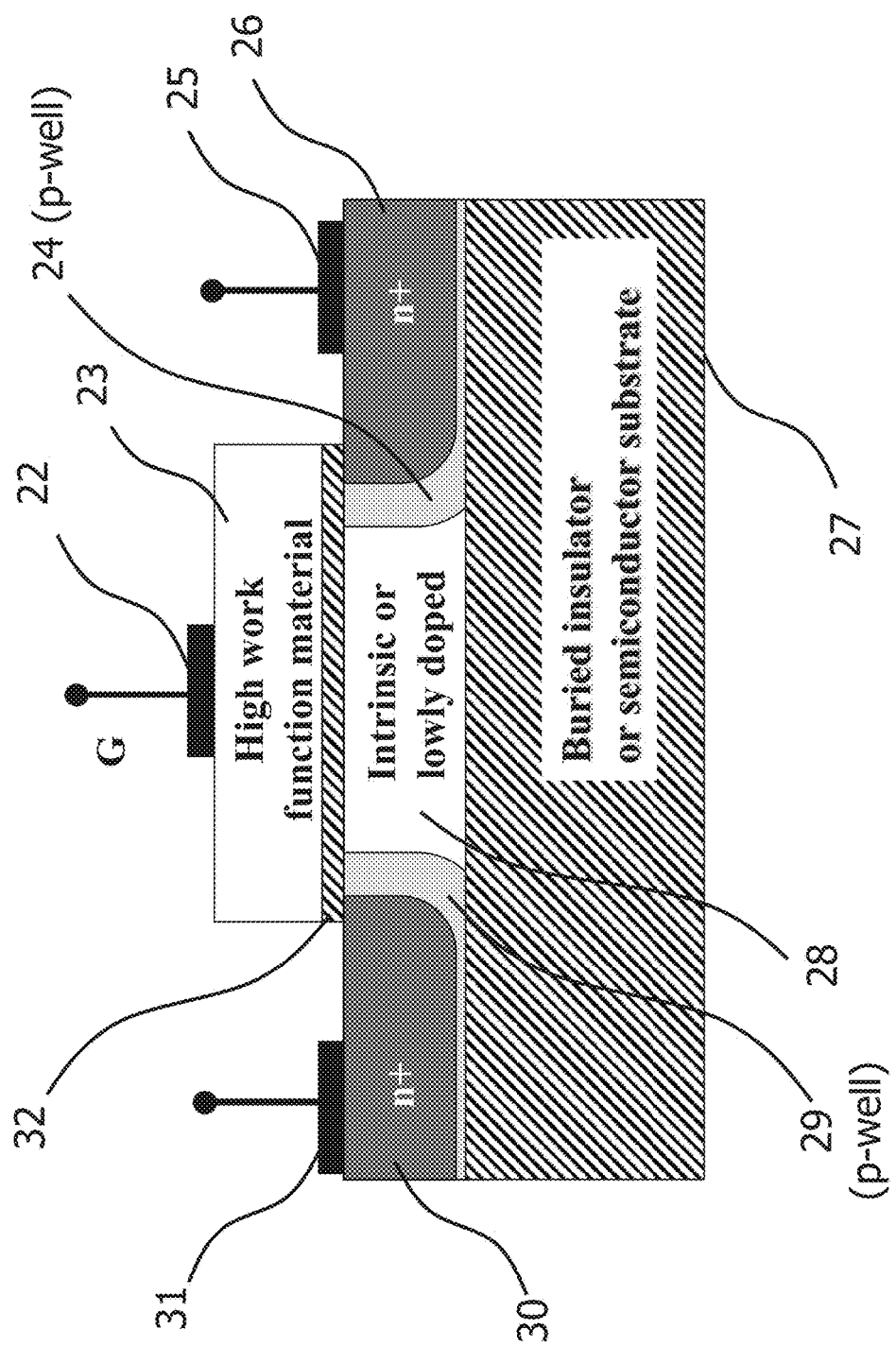
FIG. 3 shows a cross section view of a FET device according to a further embodiment of the invention, where the source and drain regions are formed in two p-wells.

As shown in FIG. 3, many doping profiles can be used in order to improve the device performance. For example, as shown in FIG. 3, the source and drain regions can be formed in two p-well regions so as to further limit the Short channel effects.

D FIG. 4

Figure 4:
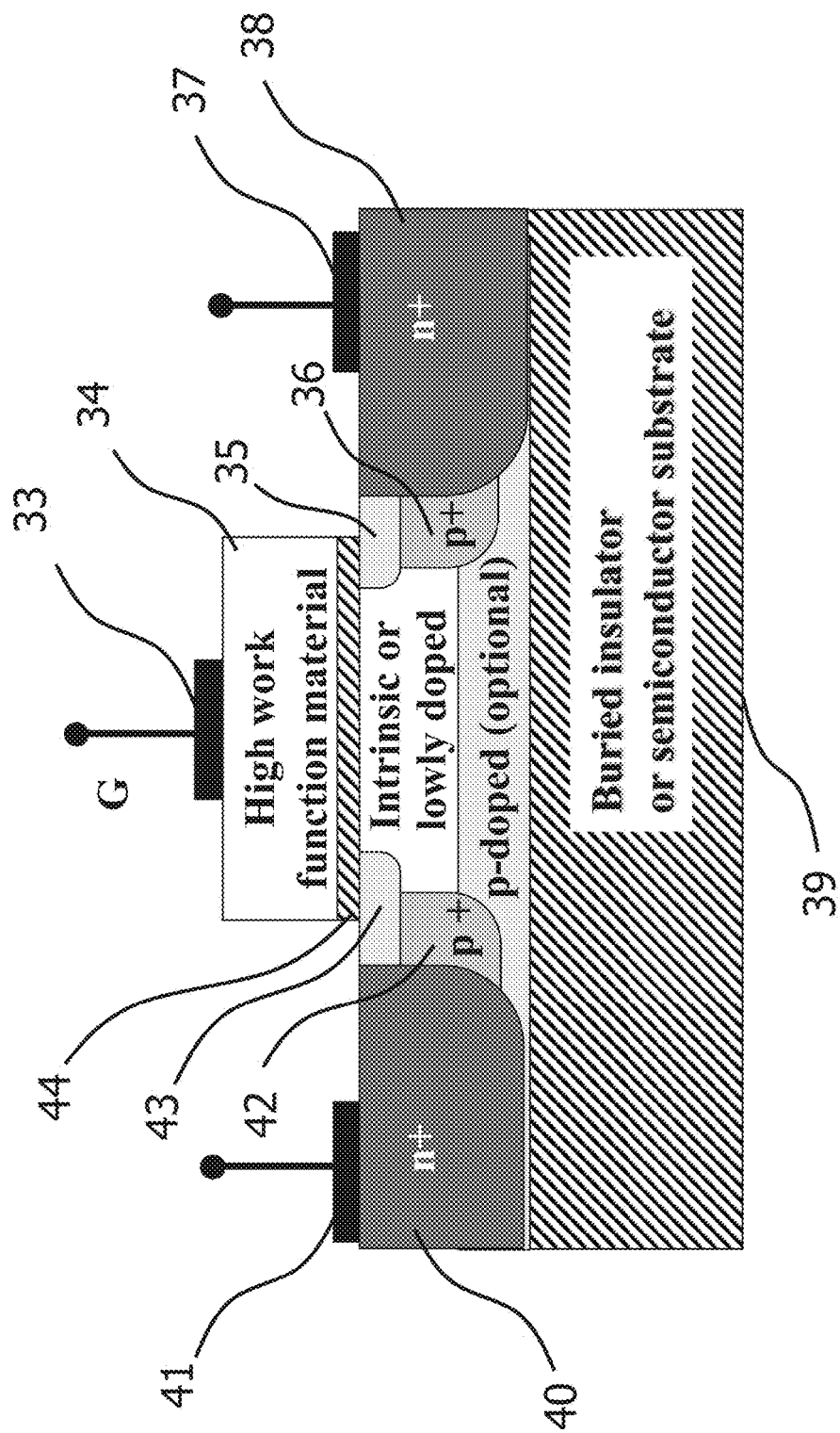
FIG. 4 shows a cross section view of a FET device according to a further embodiment of the invention, where two p+ halo and two LDD regions have been added to the structure.

As well known to anyone skilled in the art, Lightly-Doped Diffusion (LDD) regions and/or p+ halo implants can be added to any embodiments of the present invention as shown in FIG. 4. If desired, the source and drain region can be raised with respect to the intrinsic channel layer. In all the embodiments herein discussed a p-doped region can be added under the intrinsic channel as shown in FIG. 4, so as to operate as a potential barrier for the carriers, improving their confinement into the intrinsic channel. This extra region is optional and its use depends on the doping level of the channel region. Furthermore, it can be substituted with a super halo profile or other doping profiles (such as retrograde doping profiles).

E FIG. 5

Figure 5:
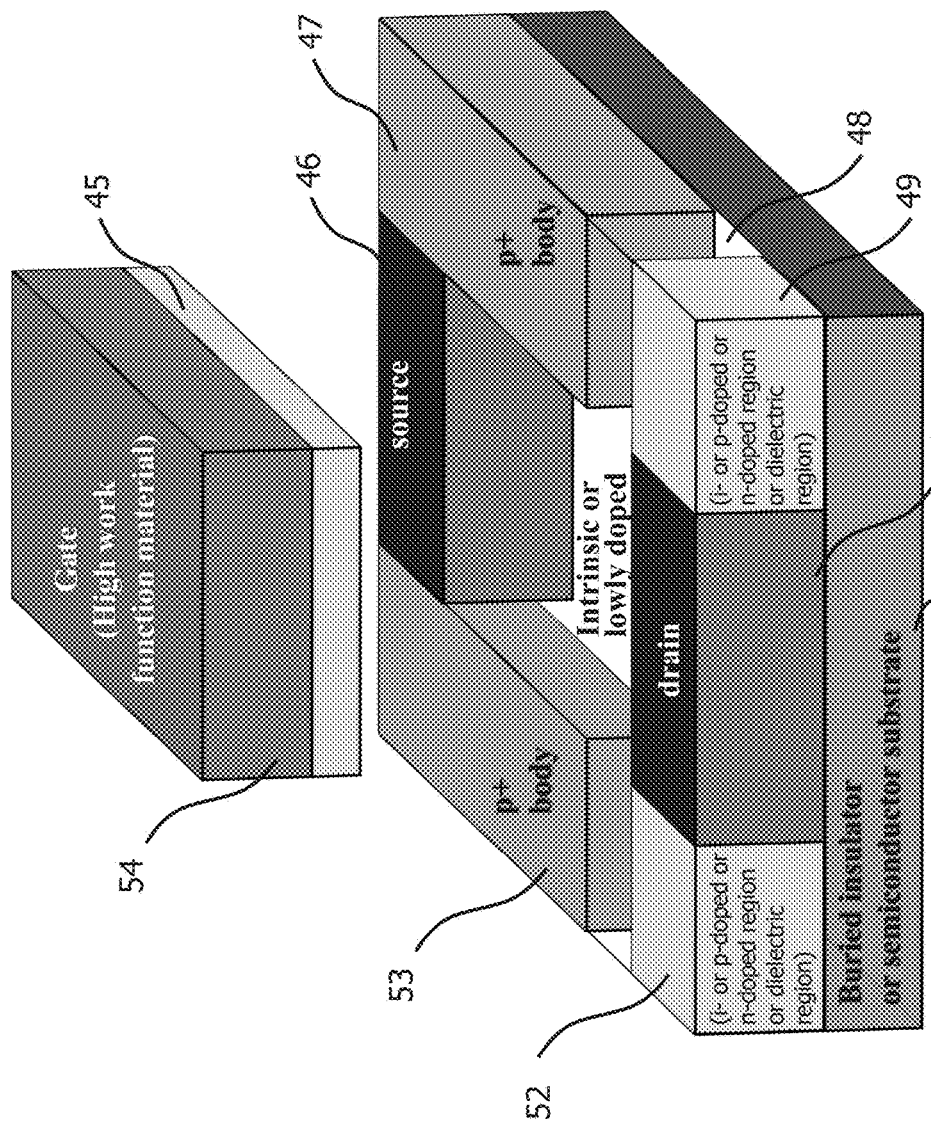
FIG. 5 shows a tridimensional view of a FET device according to a further embodiment of the invention, where the two heavily p-doped regions have been extended laterally to the source region to simplify the body connection.

As shown in FIG. 5, the heavily p-doped regions can be extended laterally to the source region and eventually shorted with it so as to simplify the body contact configuration.

F FIG. 6

Figure 6:
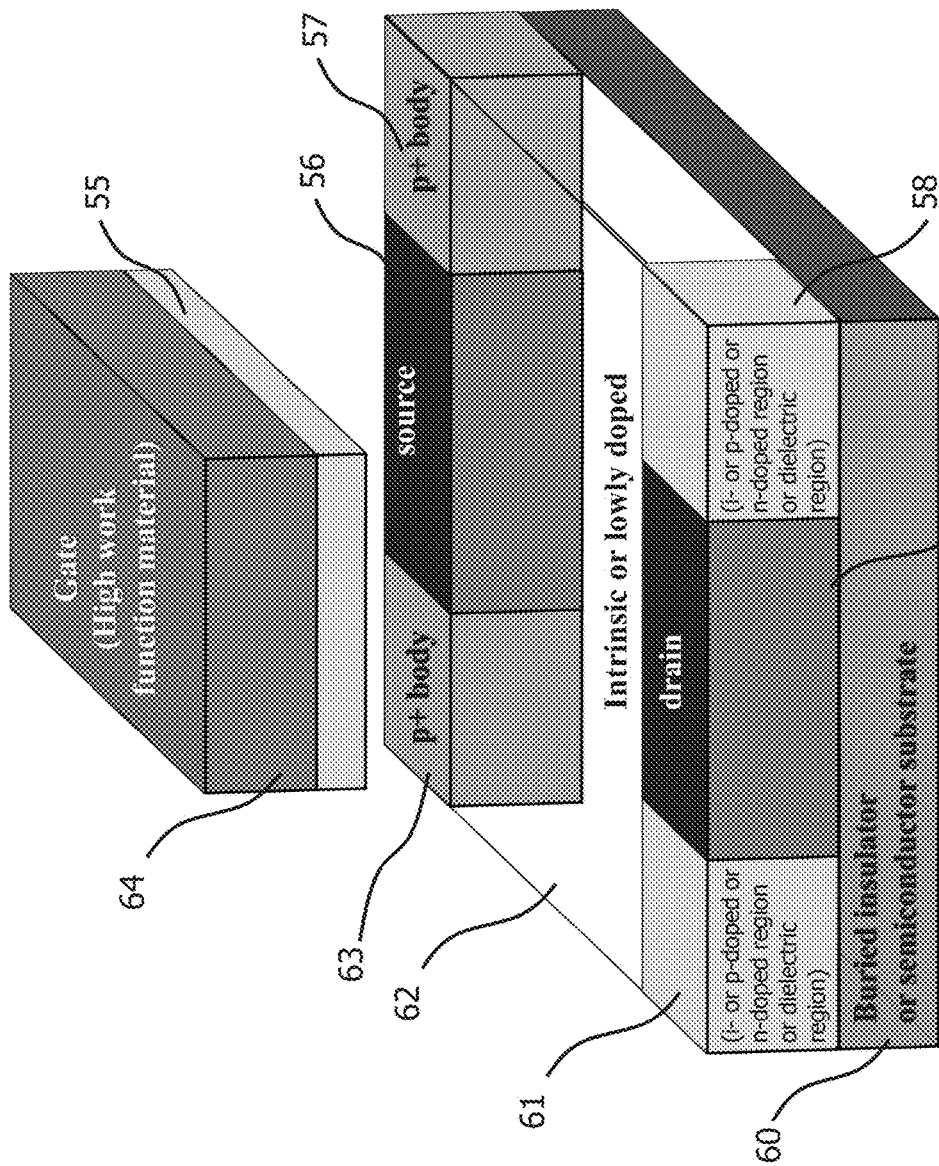
FIG. 6 shows a tridimensional view of a FET device according to a further embodiment of the invention, where the two heavily p-doped regions have been limited to the source side.

A slightly different configuration is shown in FIG. 6, where the heavily p-doped regions has been limited to the source side.

If desired, in the embodiments of FIGS. 5 and 6 one or more of the optional regions 49, 52, 58 and 61 can be removed or it can be made of intrinsic, p-doped, or n-doped semiconductor, or it can be made of dielectric material (e.g. oxide). In particular, these regions (49, 52, 58 and 61) can be also heavily n-doped so as to effectively extend the drain regions of the device beyond the intrinsic channel region. Similar considerations hold true for all the embodiments herein described.

G FIG. 7

Figure 7:
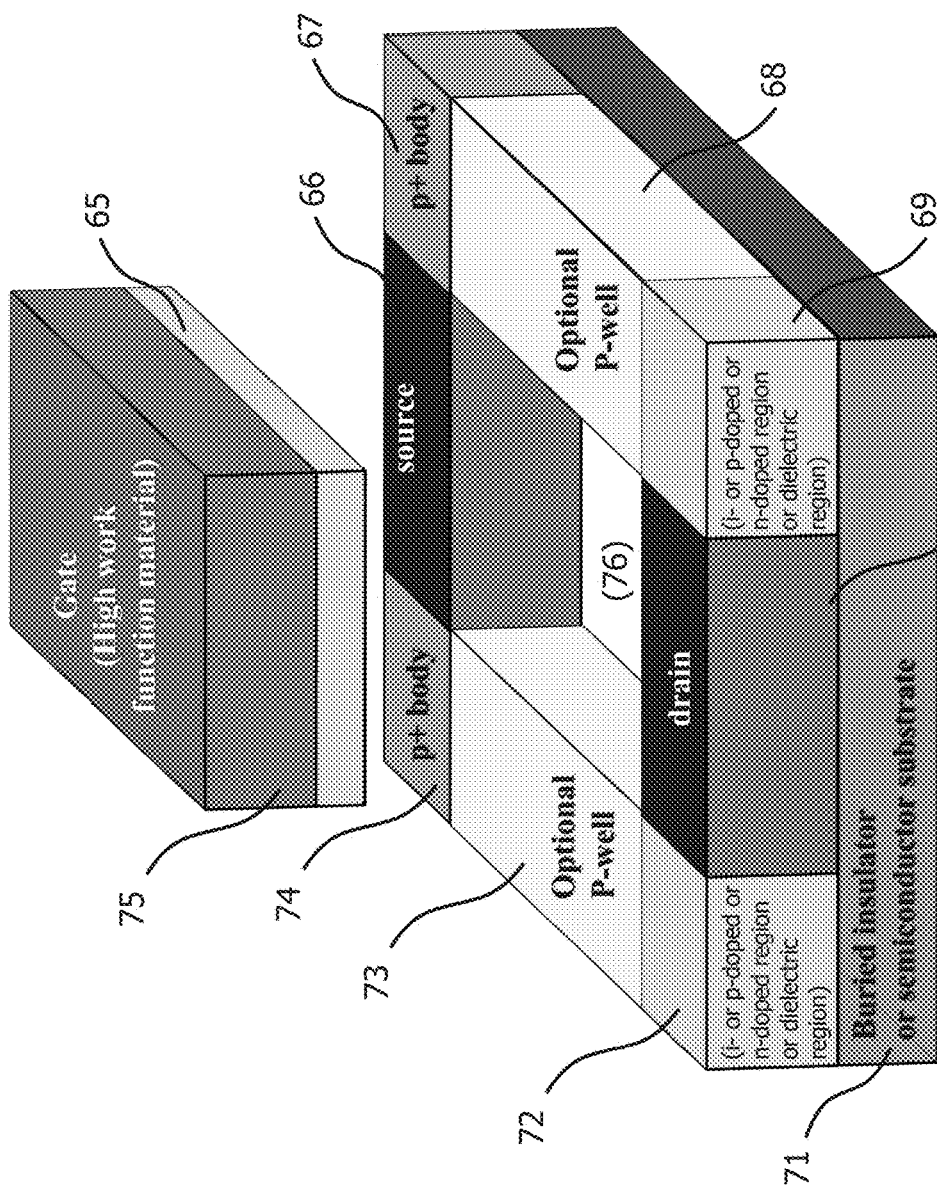
FIG. 7 shows a tridimensional view of a FET device according to a further embodiment of the invention, where two p-doped regions have been placed on the sides of the channel region.

In any of the embodiments herein discussed, one or two p-doped regions can be added laterally to the intrinsic channel as shown in FIG. 7, so as to increase the confinement of the carriers inside the channel region.

H FIG. 8

Figure 8:
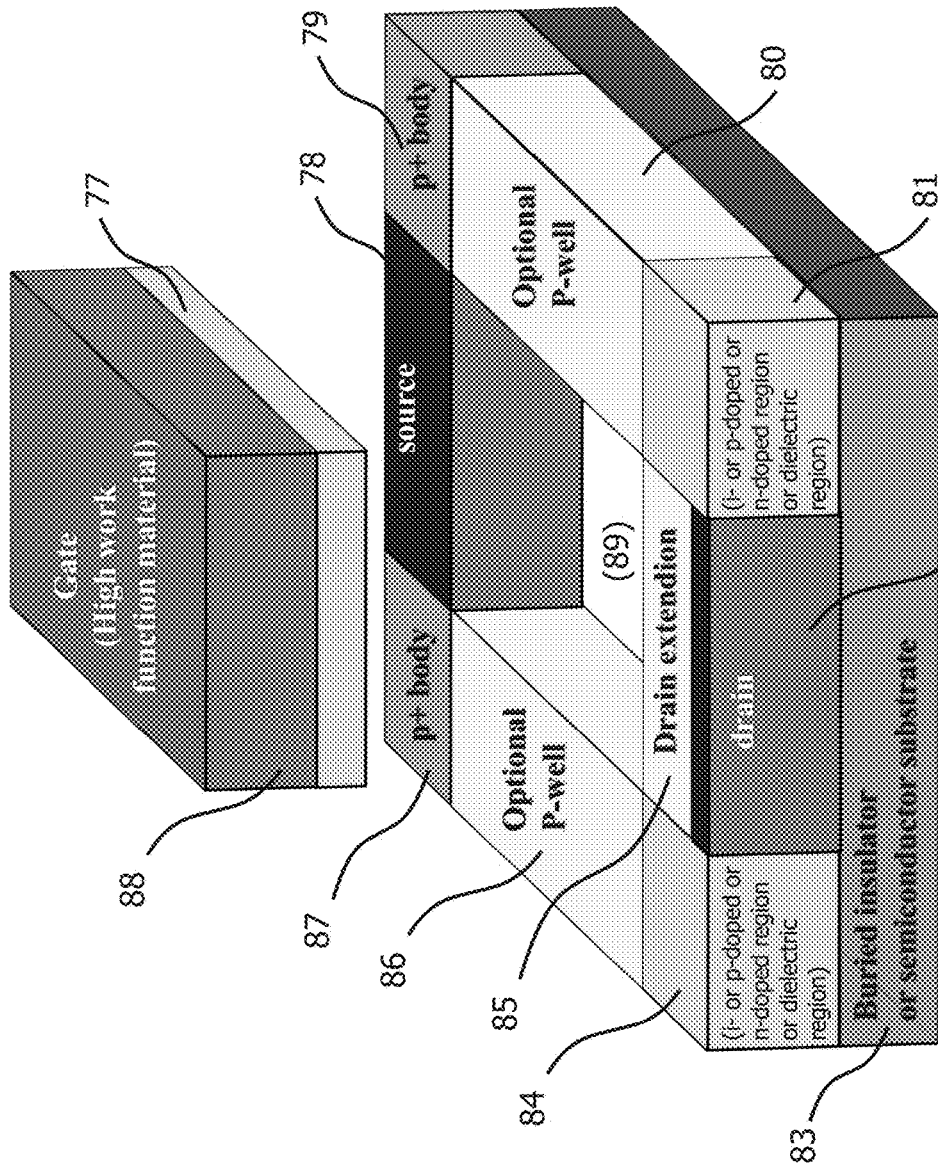
FIG. 8 shows a tridimensional view of a FET device according to a further embodiment of the invention, where a low n-doped region has been added between the gate and the drain so as to form a drain extension and increase the voltage withstanding capability of the device.

Any of the embodiments herein described can be implemented with a drain extension, where a drift region is added between the drain region and the channel region to increase the voltage withstanding capability of the device. An example of implementation of the present invention with a drain extension is shown in FIG. 8, which has been derived from the embodiment of FIG. 7. If desired, the p-doped regions 80 and 86 can be extended also laterally to the drift region or the regions 81 and 84 can be p-doped so as to form a super junction configuration on the drain side of the transistor.

I FIG. 9

Figure 9:
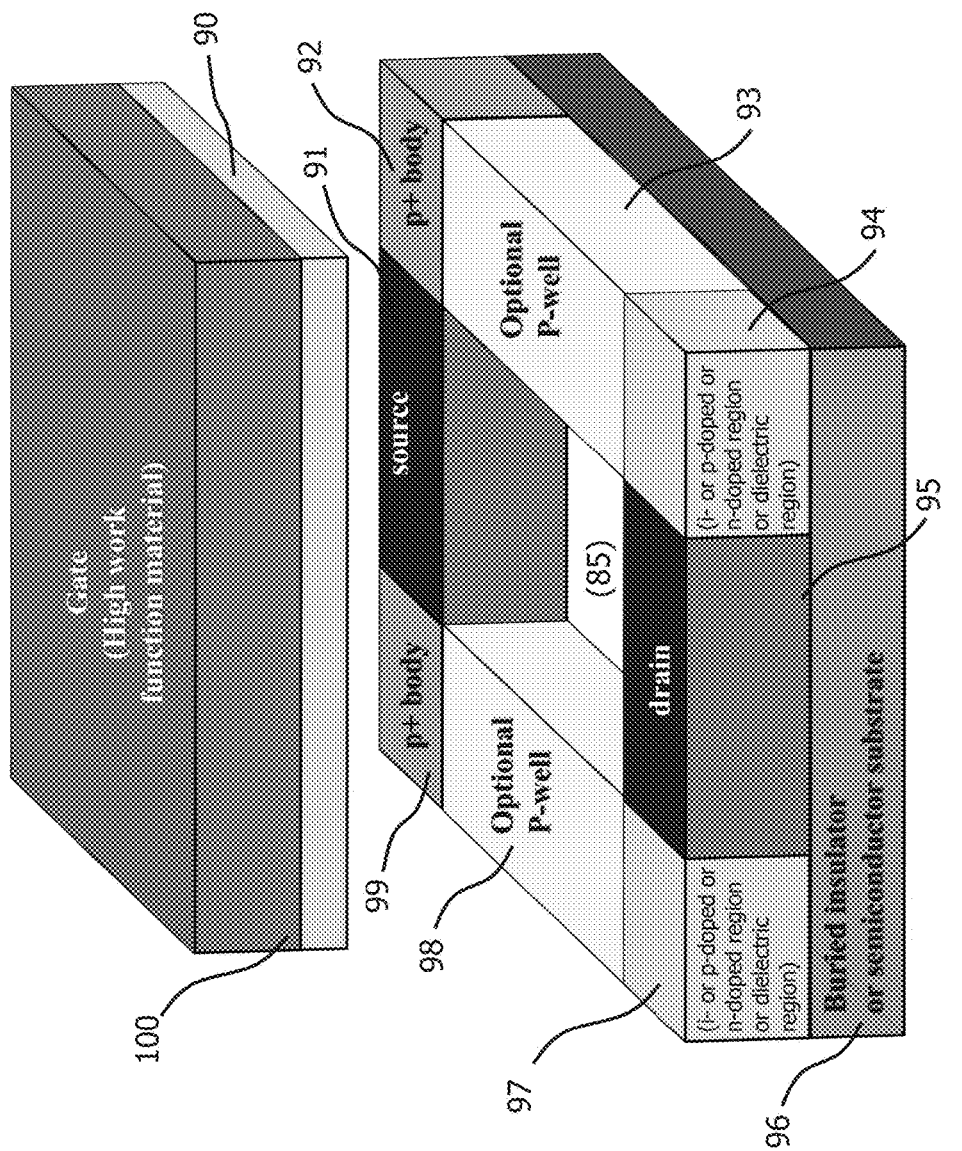
FIG. 9 shows a tridimensional view of a FET device according to a further embodiment of the invention, where the gate has been extended over the two lateral p-doped regions to increase the control on the channel conductivity.

In all the embodiments herein described, the control on the channel conductivity can be increased by extending the gate above the lateral doped regions (only on one side or on both sides), so as to use the field lines generated by the gate to laterally control the potential distribution inside the channel region. An example of embodiments of the present invention employing this principle is shown in FIG. 9.

J FIG. 10

Figure 10:
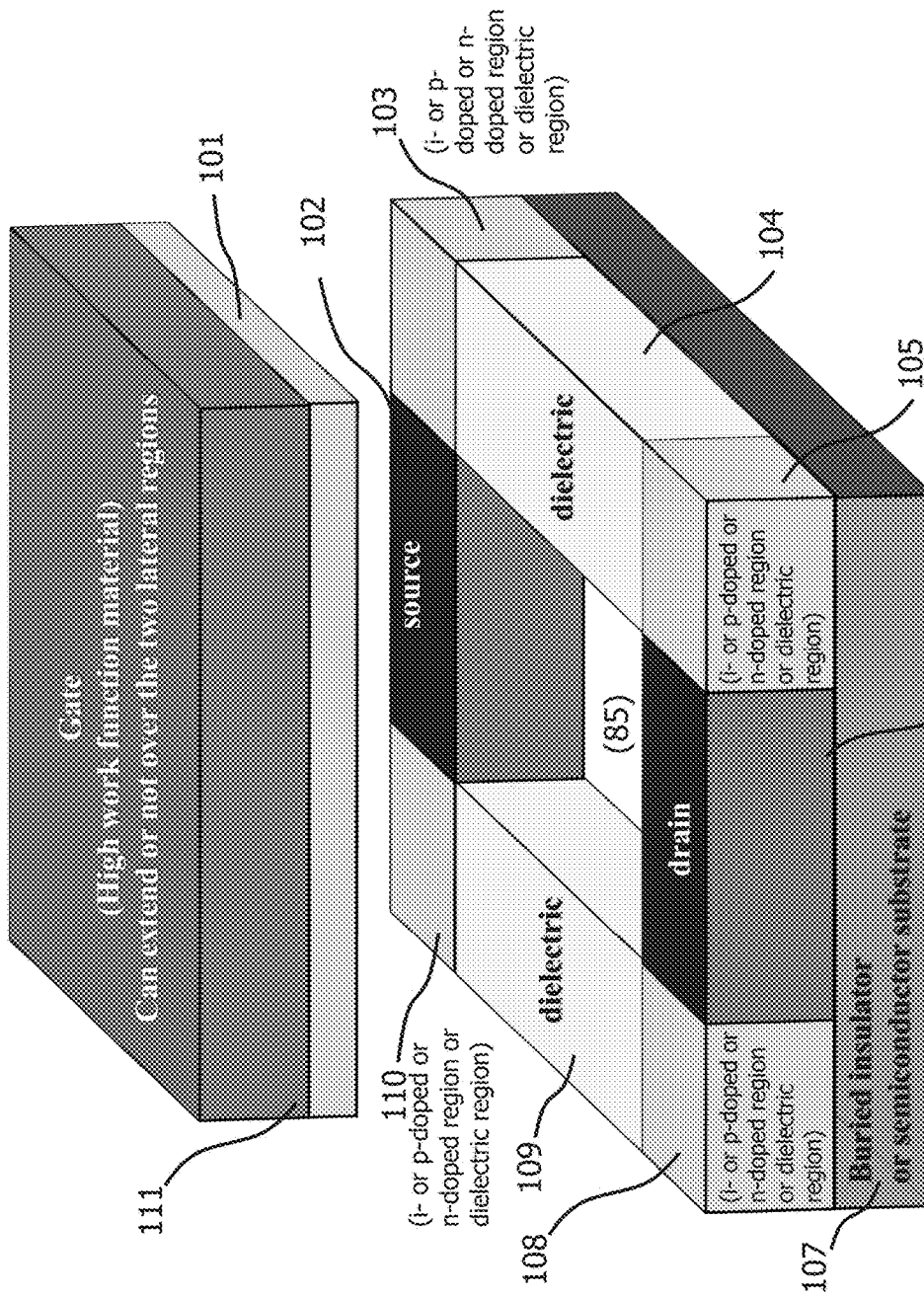
FIG. 10 shows a tridimensional view of a FET device according to a further embodiment of the invention, where the two lateral p-doped regions have been replaced with a dielectric region.

Another interesting embodiment of the present invention is shown in FIG. 10, where the lateral doped regions have been replaced by oxide regions. Also in this embodiment, the gate region can be (optionally) extended over one or both lateral regions so as to effectively increase the control on the channel conductivity.

K FIG. 11

Figure 11:
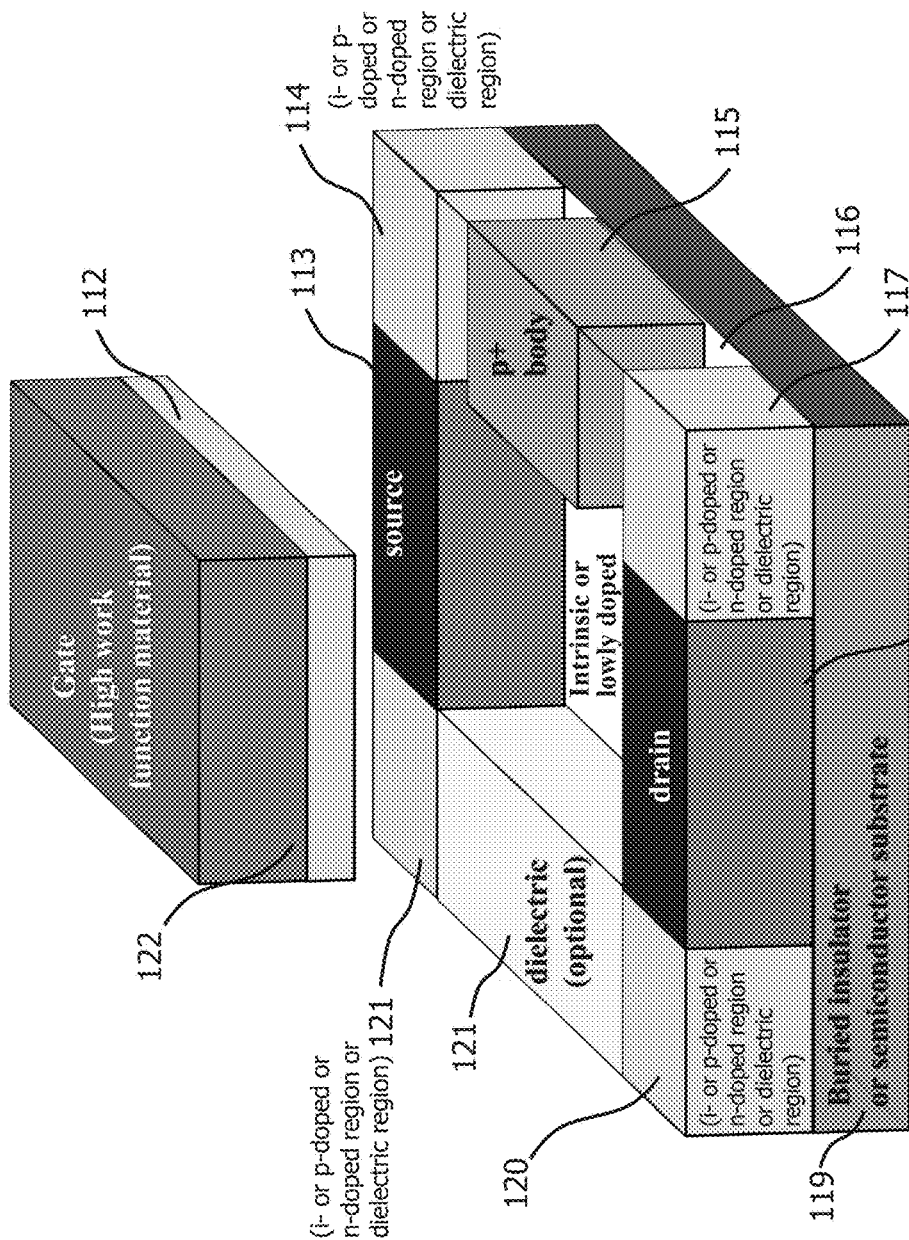
FIG. 11 shows a tridimensional view of a FET device according to a further embodiment of the invention, where a doped region has been placed on only one side of the channel region, whereas on the other side a dielectric region has been formed.

Two or more of the implementations herein discussed can be also combined. For example, as shown in FIG. 11 a p-doped region (heavily doped or moderate doped) can be placed only on one side of the device, while a dielectric region (e.g. and oxide region) is formed on the opposite side. A similar configuration can be obtained combining any of the embodiments of FIG. 1-9 with the embodiments of FIG. 10. Also in this case, if desired, the gate region can be extended over the dielectric region and/or the doped region (especially when the doped region is not heavily doped).

L FIG. 12

Figure 12:
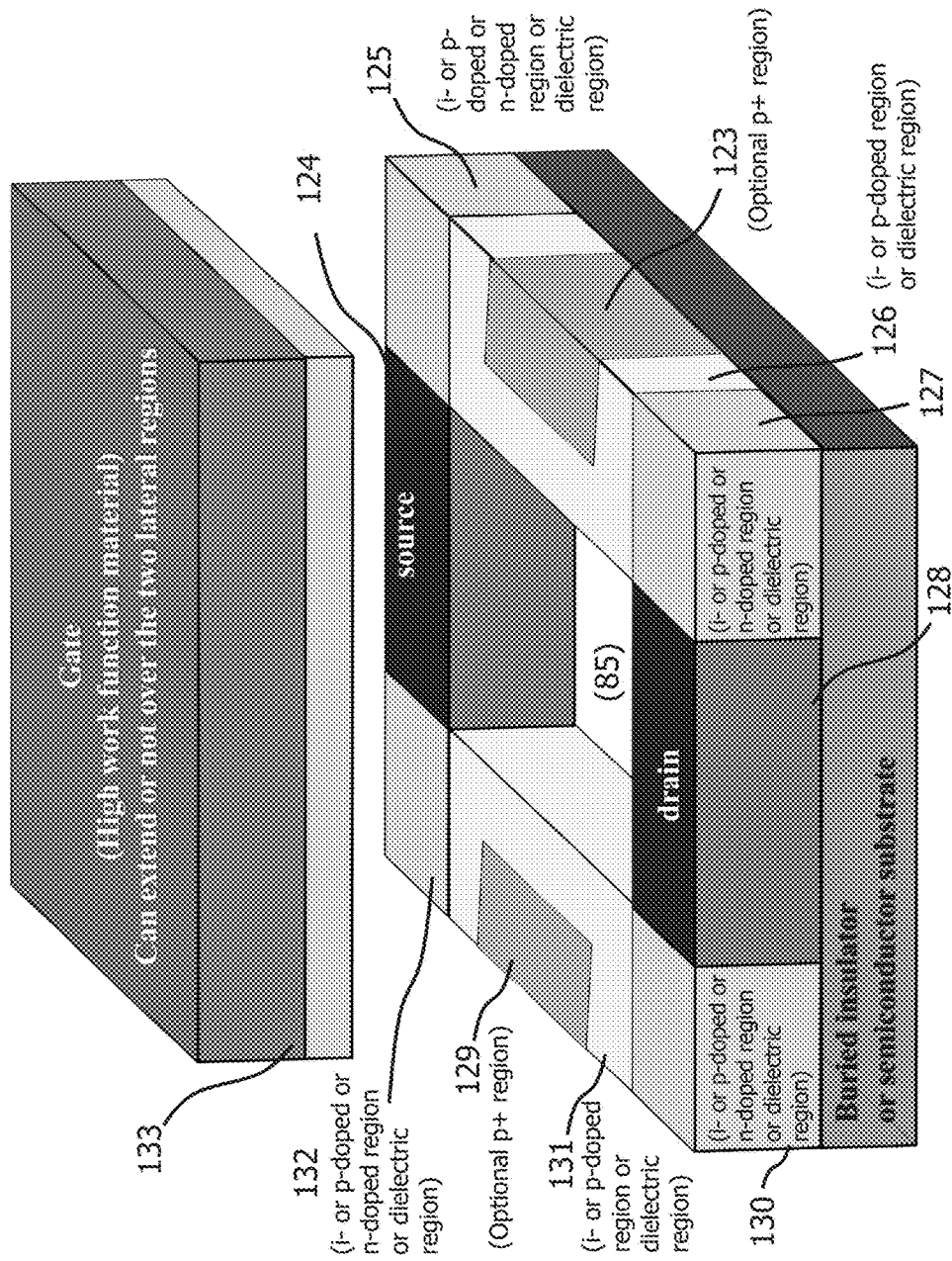
FIG. 12 depicts a tridimensional view of a FET device according to the preferred embodiment of the present invention, where a more general implementation of the invention is shown.

FIG. 12 depicts a tridimensional view of the preferred embodiment of the present invention, where a more general implementation is shown. Region 126 can be formed with a different material or different doping level with respect to region 131. Furthermore, regions 126 (and/or region 123) can extend to touch regions 127 and 125 or not. Similarly regions 131 (and/or region 129) can extend to touch regions 130 and 132 or not. If regions 126 and 131 are not heavily doped or made of dielectric material, two heavily doped regions 123 and 129 can be used (when present) to contact these regions, respectively. Alternatively, regions 125 and 132 can be heavily p-doped to guarantee the bias of regions 126 and 131.

M FIG. 13

Figure 13:
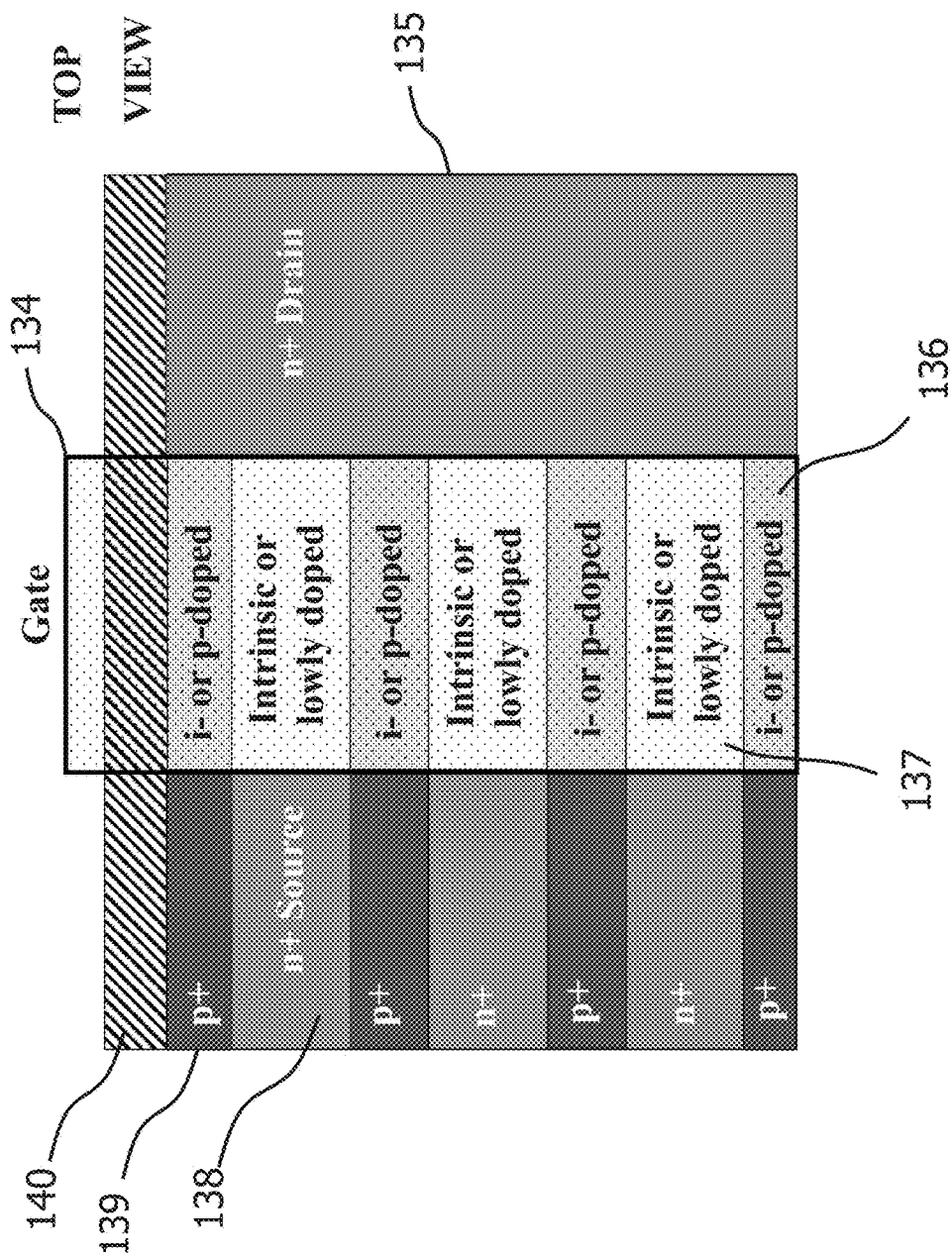
FIG. 13 shows a top view (or layout view) of a FET device according to a further embodiment of the present invention, obtained by connecting in parallel three transistors resembling the embodiment of FIG. 9.
Figure 14:
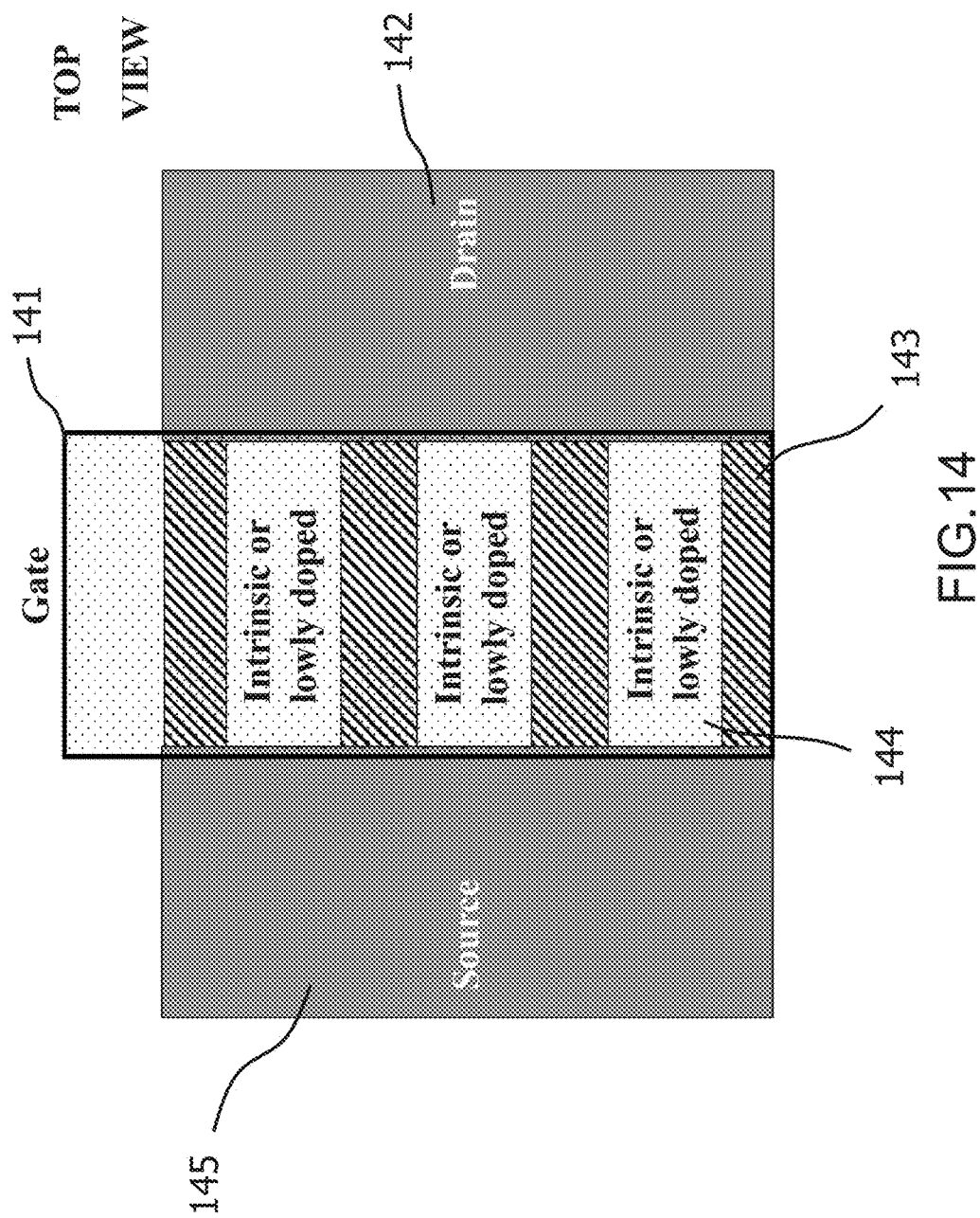
FIG. 14 shows a top view (or layout view) of a FET device according to a further embodiment of the present invention, obtained by connecting in parallel three transistors resembling the embodiment of FIG. 10.
Figure 15:
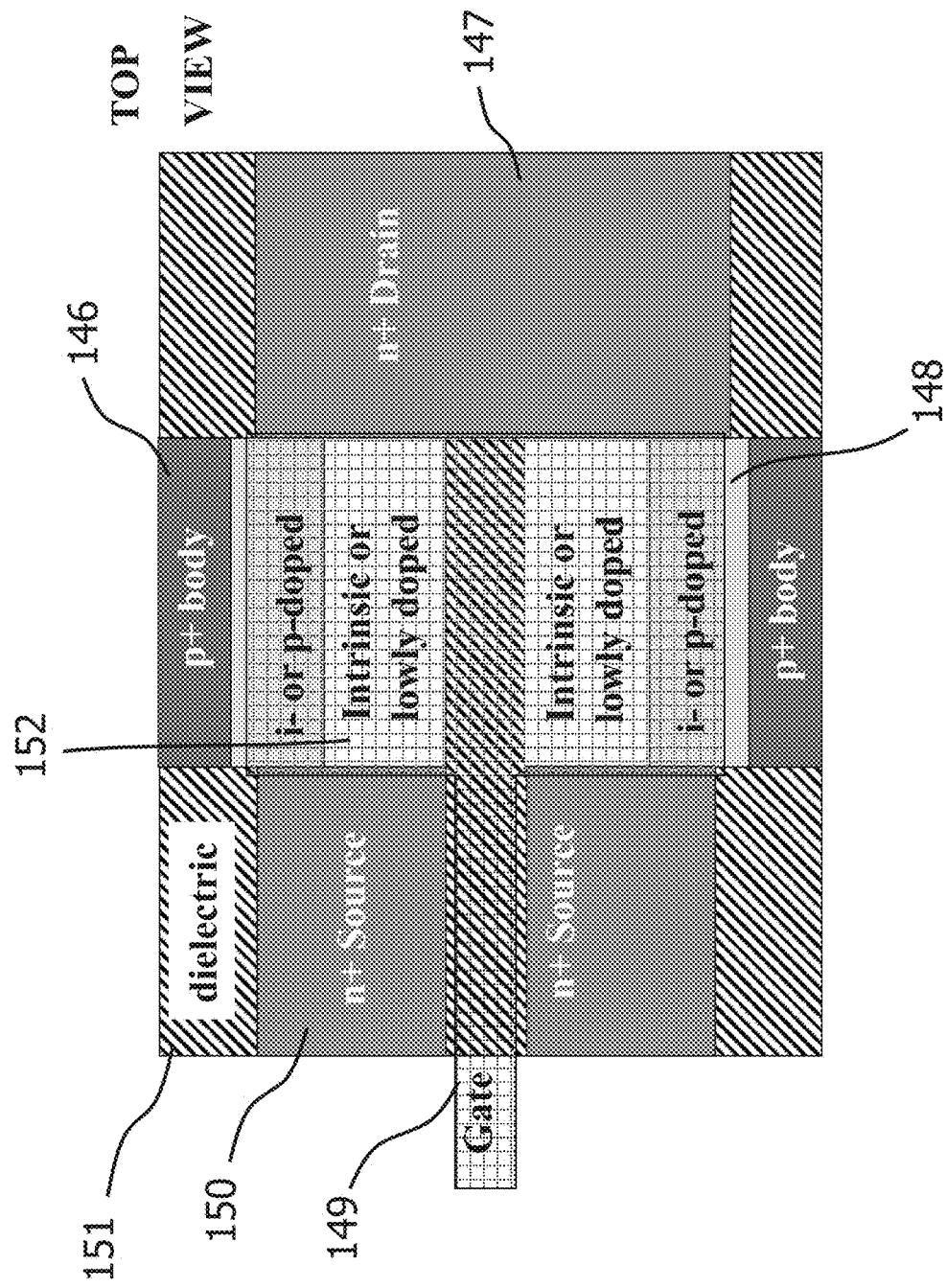
FIG. 15 shows a top view (or layout view) of a FET device according to a further embodiment of the present invention, obtained by connecting in parallel two transistors according to the embodiment of FIG. 11.

Multiple structures as the ones shown in FIG. 1-12 can be connected in parallel to increase the current capability and reduce the on-resistance of the device. Three example of multiple transistors according to the present invention connected in parallel are shown in FIG. 13-15. The embodiment of FIG. 13 illustrate the TOP view or layout view of three transistors according to the embodiment of FIG. 9 connected in parallel.

N FIG. 14

The layout of FIG. 14 is obtained by connecting in parallel three transistors resembling the embodiment of FIG. 10.

O FIG. 15

The structure of FIG. 15 is obtained by connecting in parallel two transistors according to the embodiment of FIG. 11.

P FIG. 16

Figure 16:
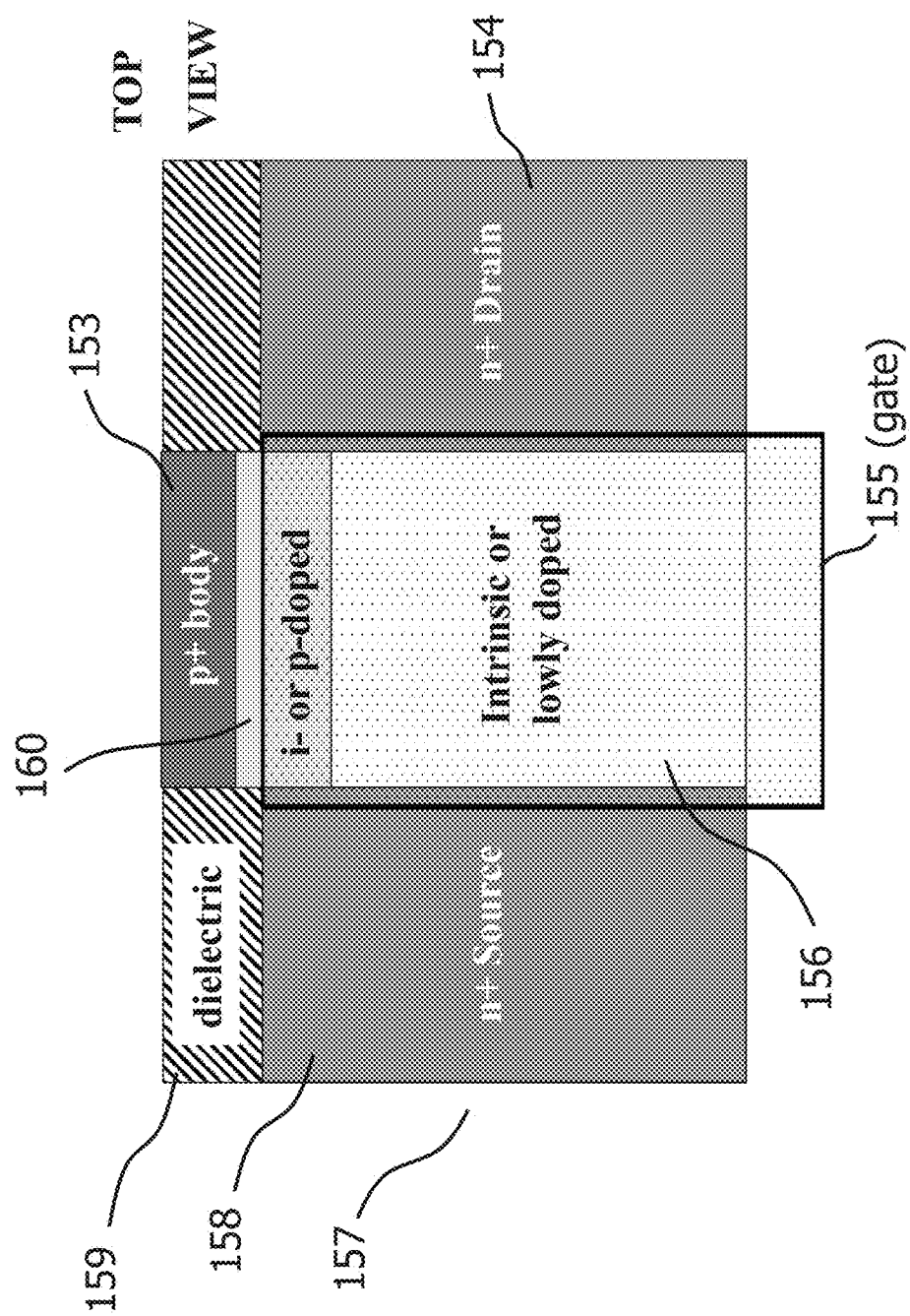
FIG. 16 shows a top view (or layout view) of a FET device according to a further embodiment of the present invention derived from the embodiment of FIG. 11 by removing the lateral dielectric region.

FIG. 16 shows a top view (or layout view) of a FET device according to a further embodiment of the present invention derived from the embodiment of FIG. 11 by removing the lateral dielectric region. In all the embodiments of the present invention a low or moderate p-doped region can be added between one or more of the heavily p-doped regions and the intrinsic (or near intrinsic) channel region.

For all the MOS structures described above, also the equivalent p-channel version can be obtained by simply substituting the n-doped regions with p-type regions and vice versa, and using a low work-function gate material (i.e. a metallic material with a work-function lower than the one of the channel region or a heavily n-doped poly-silicon layer). In general, the channel layer can be also low-doped (e.g. $<1e16$ cm$^{-3}$) with p- or n-type impurities (independently from the conductivity type of the device channel) in order to tune the threshold voltage (e.g. a n-doping can be used for lowering the threshold voltage in a n-channel MOS, whereas a p-doping type can be used to increase the threshold voltage), without degrading too much the device characteristics.

Most of the device structure described above can be obtained by means of standard CMOS manufacturing processes. If desired, the intrinsic channel layer can be grown through an epitaxial process step in order to minimize the level of doping impurities. The other process steps (implantations, gate oxide thermal growth, and gate deposition) remain almost unchanged with respect to a conventional CMOS process technology. This makes the present invention very cost attractive.

Although the present invention has been described above with particularity, this was merely to teach one of ordinary skill in the art how to make and use the invention. Many additional modifications will fall within the scope of the invention. Thus, the scope of the invention is defined by the claims which immediately follow.

What is claimed is:

1. A semiconductor field effect device structure comprising:
    a source region and a drain region;
    a channel region between said source region and said drain region;
    a semiconductor or insulating barrier region lateral to said channel region and extending in a direction between the source region and the drain region;
    a dielectric layer extending over at least a portion of said channel region;
    a gate extending over said dielectric layer;
        wherein said gate is in physical contact with said dielectric layer;
        wherein said channel region has a dopant concentration less than $1\times10^{17}$ cm$^{-3}$;
        wherein said gate has a work-function substantially equal to or greater than the sum of the electron affinity and half energy-gap of said channel region, when said semiconductor field effect device is a n-channel device;
        wherein said gate has a work-function substantially equal to or less than the sum of the electron affinity and half energy-gap of said channel region, when said semiconductor field effect device is a p-channel device; and
        wherein said semiconductor field effect device structure is an enhancement mode field effect device.

2. The structure of claim 1, wherein said gate is formed with a material belonging to the group comprising semiconductor and metallic materials.

3. The structure of claim 1, wherein said barrier region is a doped semiconductor region;
    wherein said barrier region is doped with p-type impurities, when said semiconductor field effect device is an-channel device, and
    wherein said barrier region is doped with n-type impurities, when said semiconductor field effect device is a p-channel device.

4. The structure of claim 1, wherein the doping of said channel region is not uniform.

5. The structure of claim 1, wherein said barrier region is a dielectric region.

6. The structure of claim 1, wherein said semiconductor field effect device structure is implemented in silicon on insulator technology.

7. The structure of claim 1, wherein said source region and said drain region are raised with respect to said channel region.

8. The structure of claim 1, wherein said channel region has a work-function substantially equal to the sum of the electron affinity and half energy-gap of a semiconductor material forming said channel region.

9. The structure of claim 1, further comprising a doped region under said channel region.

10. The structure of claim 1, wherein said channel region has the same conductivity type of said source and drain regions.

11. The structure of claim 1, wherein said channel region is a substantially intrinsic semiconductor region.

12. The structure of claim 1, wherein said barrier region is limited on the source side of said semiconductor field effect device.

13. The structure of claim 1,
wherein said barrier region comprises a heavily doped region and a moderate doped region,
wherein said barrier region is doped with p-type impurities, when said semiconductor field effect device is an-channel device, and
wherein said barrier region is doped with n-type impurities, when said semiconductor field effect device is a p-channel device.

14. A method for forming a semiconductor field effect device structure comprising:
forming a source region and a drain region;
forming a dielectric layer extending over at least a portion of a channel region, wherein the channel region is between said source region and said drain region;
forming a gate extending over at least a portion of said dielectric layer;
wherein said gate is in physical contact with said dielectric layer;
wherein said channel region has a dopant concentration less than $1 \times 10^{17}$ cm$^{-3}$;
wherein a semiconductor or insulating barrier region is present lateral to said channel region and extends in a direction between the source region and the drain region;
wherein said gate has a work-function substantially equal to or greater than the sum of the electron affinity and half energy-gap of said channel region, when said semiconductor field effect device is a n-channel device;
wherein said gate has a work-function substantially equal to or less than the sum of the electron affinity and half energy-gap of said channel region, when said semiconductor field effect device is a p-channel device; and
wherein said semiconductor field effect device structure is an enhancement mode field effect device.

15. The method of claim 14, wherein said gate is formed with a material belonging to the group comprising semiconductor and metallic materials.

16. The method of claim 14, wherein said barrier region is a doped semiconductor region;
wherein said barrier region is doped with p-type impurities, when said semiconductor field effect device is an-channel device, and
wherein said barrier region is doped with n-type impurities, when said semiconductor field effect device is a p-channel device.

17. The method of claim 14, wherein said channel region is a substantially intrinsic semiconductor region.

18. The method of claim 14, wherein said barrier region is a dielectric region.

19. The method of claim 14, wherein said semiconductor field effect device structure is implemented in silicon on insulator technology.

20. The method of claim 14, further comprising forming a doped region under said channel region.

* * * * *